(12) United States Patent
Benedict

(10) Patent No.: US 7,479,828 B2
(45) Date of Patent: Jan. 20, 2009

(54) SELECTING SAMPLES FOR AMPLIFIER DIGITAL PREDISTORTION ESTIMATION

(75) Inventor: Russell B. Benedict, Bridgewater, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 102 days.

(21) Appl. No.: 11/456,670

(22) Filed: Jul. 11, 2006

(65) Prior Publication Data

US 2007/0216480 A1 Sep. 20, 2007

Related U.S. Application Data

(63) Continuation-in-part of application No. 11/274,927, filed on Nov. 15, 2005.

(51) Int. Cl.
*H03F 1/26* (2006.01)
(52) U.S. Cl. ..................................................... 330/149
(58) Field of Classification Search ................ 330/149; 455/126; 375/296
See application file for complete search history.

(56) References Cited

U.S. PATENT DOCUMENTS 5,867,065 A * 2/1999 Leyendecker ................ 330/149
7,151,405 B2 * 12/2006 Nezami ....................... 330/149

* cited by examiner

*Primary Examiner*—Robert Pascal
*Assistant Examiner*—Hieu P Nguyen

(57) ABSTRACT

The present invention provides a method for selecting samples for digital amplifier predistortion estimation. The method may include accessing a plurality of samples. Each sample includes information associated with an input signal and a corresponding output signal of the amplifier. The plurality of samples includes at least one first sample acquired at a first time and at least one second sample acquired at a second time displaced from the first time by at least one selected time interval. The method may also include selecting a subset of the plurality of samples based on a sample distribution and determining a transfer function associated with the amplifier based on the subset of the plurality of samples. The method further includes determining a predistortion function based on the transfer function and applying the predistortion function to the input signal of the amplifier.

30 Claims, 14 Drawing Sheets

SELECTING SAMPLES FOR AMPLIFIER DIGITAL PREDISTORTION ESTIMATION

CROSS REFERENCE TO RELATED APPLICATIONS

This application is a continuation-in-part of U.S. patent application Ser. No. 11/274,927, filed on Nov. 15, 2005.

BACKGROUND OF THE INVENTION

1. Field of the Invention

This invention relates generally to communication systems, and, more particularly, to wireless communication systems.

2. Description of the Related Art

An ideal amplifier receives an input signal and provides an amplified output signal without introducing any phase, amplitude, or frequency distortion. However, in practice amplifiers are rarely, if ever, ideal and so the amplified output signal generally includes phase, amplitude, and/or frequency distortions introduced by the amplifier. The amplified output signal may be linearized to remove some or all of the distortions introduced by the amplifier. Predistortion of the input signal is one technique for linearizing the amplified output signal. To predistort the input signal, samples of the input and output waveforms are captured and compared to determine the amplifier response, which is usually represented as a matrix. The amplifier response matrix may then be inverted and applied to the input signal to predistort the input signal.

Predistortion is a computationally intensive operation. For example, to predistort a radiofrequency signal used in wireless communication, some 8000 to 32,000 samples of the input and output waveforms may be captured and used to determine a non-linear transfer characteristic that represents the response of the amplifier. The amplifier's transfer function must be periodically reevaluated to maintain the accuracy of the predistortion correction function, at least in part because the amplifier response matrix may change over time due to fluctuations in the transmission power, the ambient temperature, and other intrinsic and/or environmental factors. For example, elements of the amplifier transfer function may change on time scales less than 2 seconds. However, the large number of matrix manipulations required to determine the predistortion correction may take as long as several seconds to perform. Consequently, predistortion of the radiofrequency signals used in wireless communication typically cannot be implemented in real time.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the present invention, a method is provided for selecting samples for digital amplifier predistortion estimation. The method may include accessing a plurality of samples. Each sample includes information associated with an input signal and a corresponding output signal of the amplifier. The plurality of samples includes at least one first sample acquired at a first time and at least one second sample acquired at a second time displaced from the first time by at least one selected time interval. The method may also include selecting a subset of the plurality of samples based on a sample distribution and determining a transfer function associated with the amplifier based on the subset of the plurality of samples.

BRIEF DESCRIPTION OF THE DRAWINGS

The invention may be understood by reference to the following description taken in conjunction with the accompanying drawings, in which like reference numerals identify like elements, and in which.

Figure 1:
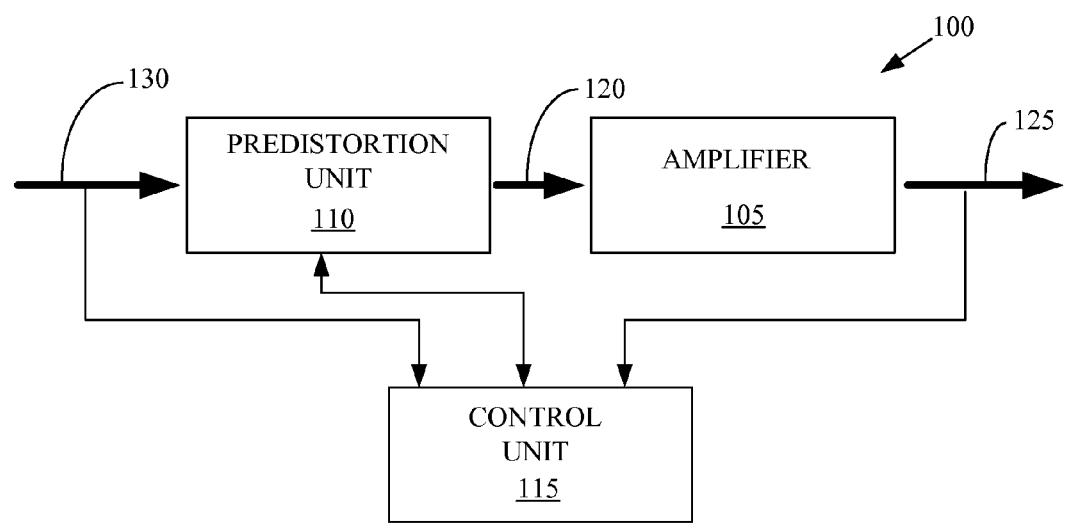
FIG. 1 conceptually illustrates one exemplary embodiment of an amplifier system, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 conceptually illustrates one exemplary embodiment of an amplifier system 100. In the illustrated embodiment, the amplifier system 100 includes an amplifier 105, a predistortion unit 110, and a control unit 115. For example, the amplifier 105 may be a radiofrequency amplifier that may be used in a wireless communication device such as a base station, a router, a cellular telephone, a personal data assistant, a smart phone, a text messaging device, a wireless card, a laptop computer, a desktop computer, and the like. Persons of ordinary skill in the art should appreciate that the amplifier 105, the pre-distortion unit 110, and/or the control unit 115 may be implemented in any number and/or type of devices. Moreover, these elements may be implemented in software, firmware, hardware, or any combination thereof.

The amplifier 105 is configured to amplify a signal 120 to form an amplified signal 125. The amplifier 105 may introduce one or more phase, amplitude, and/or frequency distortions into the amplified signal 125. Accordingly, the predistortion unit 110 is configured to predistort an input signal 130 to form the signal 120 that is provided to the amplifier 105. The control unit 115 is configured to receive samples including information indicative of the signal 120 and the amplified signal 125 and to use these samples to determine a non-linear transfer function associated with the amplifier 105. The control unit 115 is also configured to determine and apply one or more predistortion coefficients that may be provided to the predistortion unit 110 and used to pre-distort the input signal 130.

Techniques for forming the non-linear transfer function to determine the one or more predistortion functions and/or coefficients, such as the "Cross Correlator Predistorter" approach, are known to persons of ordinary skill in the art and, in the interest of clarity, only those aspects of determining and/or applying the predistortion functions and/or coefficients that are relevant to the present invention will be discussed further herein. In one exemplary embodiment of the Cross Correlator Predistorter approach, a response matrix (which may also be referred to as a correlation matrix) representative of a system of equations that determine the non-linear transfer function associated with the amplifier 105 may be determined using the samples. The response matrix may be inverted and/or solved used to solve a system of equations and thereby determine the non-linear transfer function associated with the amplifier 105.

Figure 2A:
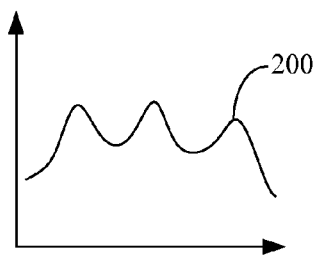
FIGS. 2A, 2B, and 2C conceptually illustrated exemplary embodiments of signals such as may be provided to and/or formed by portions of the amplifier system shown in FIG. 1, in accordance with the present invention.
Figure 2B:
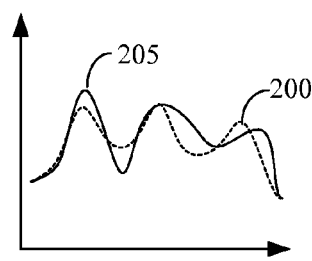
Figure 2C:
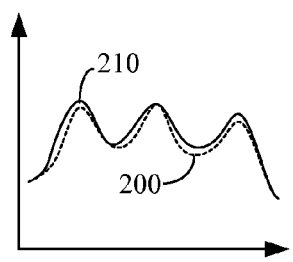

In operation, the predistortion unit 110 receives the input signal 130. One illustrative example of an input signal 200 is shown in FIG. 2A. The units for the axes shown in FIG. 2A are arbitrary. The predistortion unit 110 may then apply one or more predistortion coefficients to the input signal 130 to form the signal 120. One illustrative example of a predistorted signal 205 is shown in FIG. 2B. The units for the axes shown in FIG. 2B are arbitrary. The input signal 200 is also shown as a dashed line in FIG. 2B and the predistortion of the input signal 200 may be seen by comparing the input signal 200 to the predistorted signal 205. The signal 120 may then be provided to the amplifier 105, which may amplify the signal 120 to form the output signal 125. One illustrative example of an output signal 210 is shown in FIG. 2C. The units for the axes shown in FIG. 2C are arbitrary. The input signal 200 is also shown as a dashed line in FIG. 2C. The distortion of the output signal 210 is reduced by the predistortion of the input signal 200, as may be seen by comparing the input signal 200 to the output signal 210.

In one embodiment of the present invention, the control unit 115 may select a subset of the samples based on a sample distribution. The control unit 115 may also apply one or more weighting functions to the selected subset of the samples. The control unit 115 may then determine the response matrix associated with the amplifier 105 based on the subset of the plurality of samples, as will be discussed in detail below. The response matrix may then be inverted and/or solved, e.g., by the control unit 115, to determine the transfer function associated with the amplifier 105.

Figure 3A:
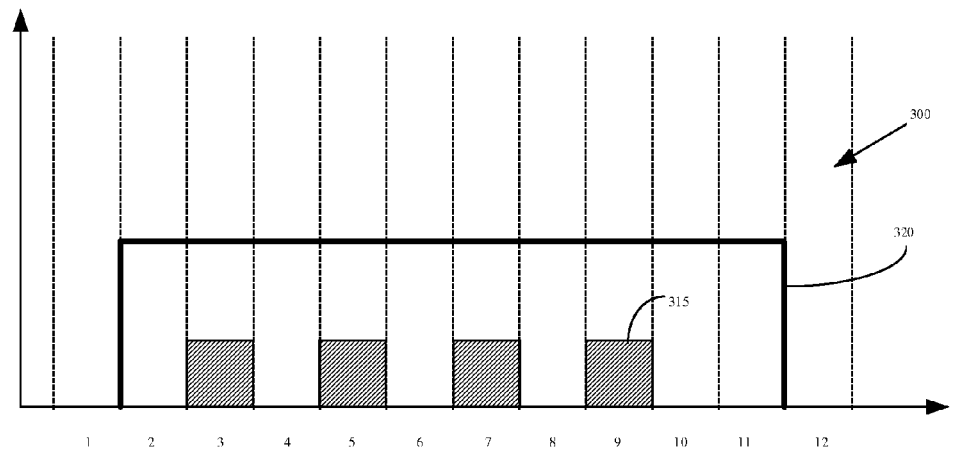
FIGS. 3A, 3B, and 3C conceptually illustrate three exemplary embodiments of sample distributions, in accordance with the present invention.
Figure 3B:
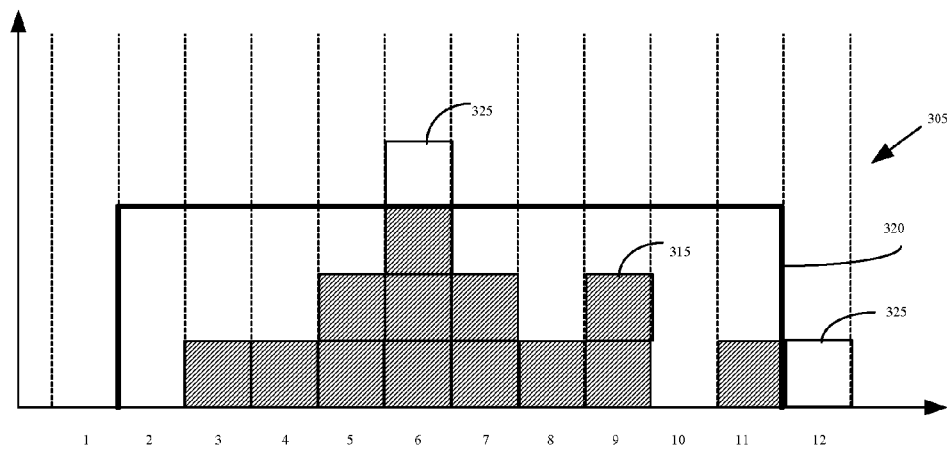
Figure 3C:
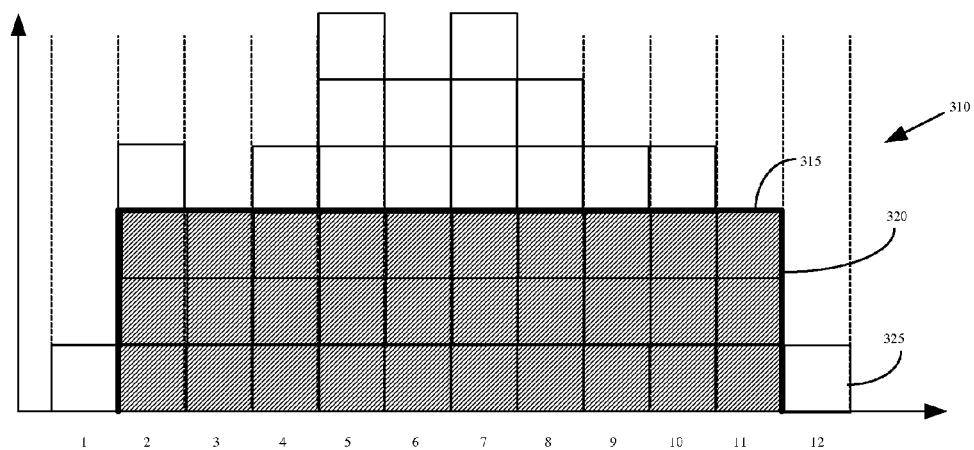

FIGS. 3A, 3B, and 3C conceptually illustrate three exemplary embodiments of sample distributions 300, 305, 3 10. The vertical axis in FIGS. 3A, 3B, and 3C indicates the number of samples and the horizontal axis indicates a bin number. The bin numbers may be associated with any desirable variable, such as a received radio frequency power. In the illustrated embodiment, the sample distribution 300 is depicted in FIG. 3A at a first (relatively early) stage in collecting and/or accessing samples including information indicative of an input and an output signal associated with an amplifier system. The sample distribution 305 is depicted in FIG. 3B at a second (intermediate) stage in collecting and/or accessing samples and the sample distribution 310 is depicted in FIG. 3C at the end of the collection and/or access period. Persons of ordinary skill in the art having benefit of the present disclosure should appreciate that the collection and/or access period is a matter of design choice and may be determined in any manner. For example, the collection and/or access period may be fixed time interval. For another example, the collection and/or access period may end when a predetermined number of samples have been collected or when some other criterion or threshold has been reached.

The sample distribution 300 shown in FIG. 3A includes four samples 315 (only one indicated in FIG. 3A) that have been placed in bins 3, 5, 7, and 9, respectively. A target sample distribution 320 is also shown in FIG. 3A. In the illustrated embodiment, the target sample distribution 320 is a flat distribution over the dynamic range extending from bin 2 to bin 11. However, as discussed below, any desirable target sample distribution 320 may be used. Each of the samples 315 fall within the target sample distribution 320 and so they may be selected as part of the subset of samples that may be used to determine the response matrix of the associated amplifier, as indicated by the cross-hatching. In one embodiment, each sample 315 that is selected to be part of the subset of samples may be used to generate an instantaneous (or partial) response matrix, which may be added to an average response matrix.

The sample distribution 305 shown in FIG. 3B includes 13 samples 315 (only one indicated in FIG. 3B) that fall within the target sample distribution 320 and so may be selected as part of the subset of samples that may be used to determine the response matrix of the associated amplifier, as indicated by the cross-hatching. However, the samples 325 fall outside of the target sample distribution 320 and so the samples 325 may not be selected as part of the subset of samples that may be used to determine the response matrix of the associated amplifier.

The sample distribution 310 shown in FIG. 3C includes samples 315 (only one indicated in FIG. 3C) that substantially fill the target sample distribution 320 and so all of the samples 315 may be selected as part of the subset of samples that may be used to determine the response matrix of the associated amplifier, as indicated by the cross-hatching. The samples 325 that fall outside of the target sample distribution 320 may not be selected as part of the subset of samples that may be used to determine the response matrix of the associated amplifier. By selecting the samples 315 that correspond to the target sample distribution 320, the number of samples 315 used to determine the response matrix may be reduced and an error associated with the linearization function for the amplifier may be equalized over the dynamic range associated with the target sample distribution 320.

Figure 4:
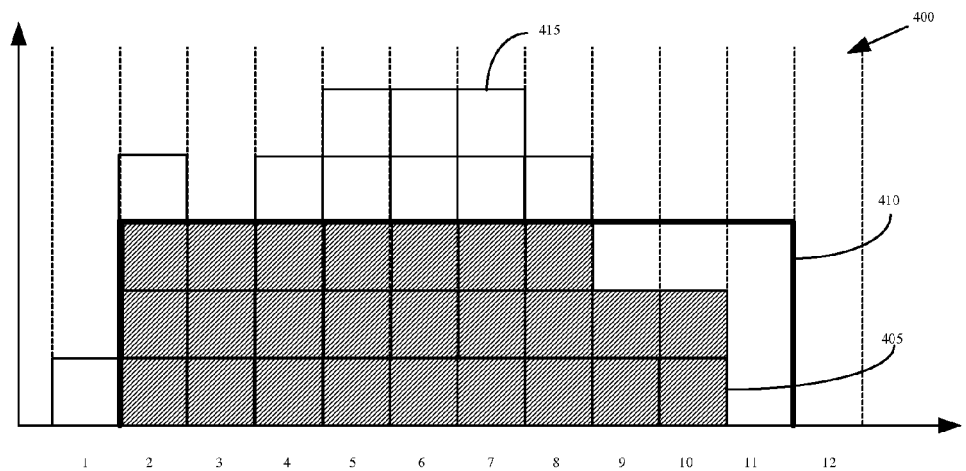
FIG. 4 conceptually illustrates one exemplary embodiment of a sample distribution at the end of a collection and/or access period, in accordance with the present invention.

FIG. 4 conceptually illustrates one exemplary embodiment of a sample distribution 400 at the end of a collection and/or access period. The vertical axis in FIG. 4 indicates the number of samples and the horizontal axis indicates a bin number. In the illustrated embodiment, the samples 405 have been selected to be part of the subset of samples that may be used to determine a response matrix associated with an amplifier, as indicated by the crosshatching. The samples 405 have been selected because they fall within a target sample distribution 410. Samples 415 have not been selected to be part of the subset of samples because the samples 415 fall outside of the sample distribution 410. Although FIG. 4 depicts the sample distribution 400 at the end of the collection and/or access period, the target sample distribution 410 has not been completely filled by selected samples 405. For example, only two samples 405 have been selected from bins 9 and 10 and no samples fell within bin 11.

A weighting function may be applied to the sample distribution 400. In one embodiment, the weighting function may be applied to correct the selected samples 405 to approximately match the target sample distribution 410. For example, the samples 405 in the bins 9-10 may each be weighted by a multiplicative factor of 3/2 to approximately match the target sample distribution 410. The bin 11 does not contain any information, and so a weighting function may not be applied to this bin. Persons of ordinary skill in the art should appreciate that the particular form of the weighting function is a matter of design choice and not material to the present invention.

Figure 5A:
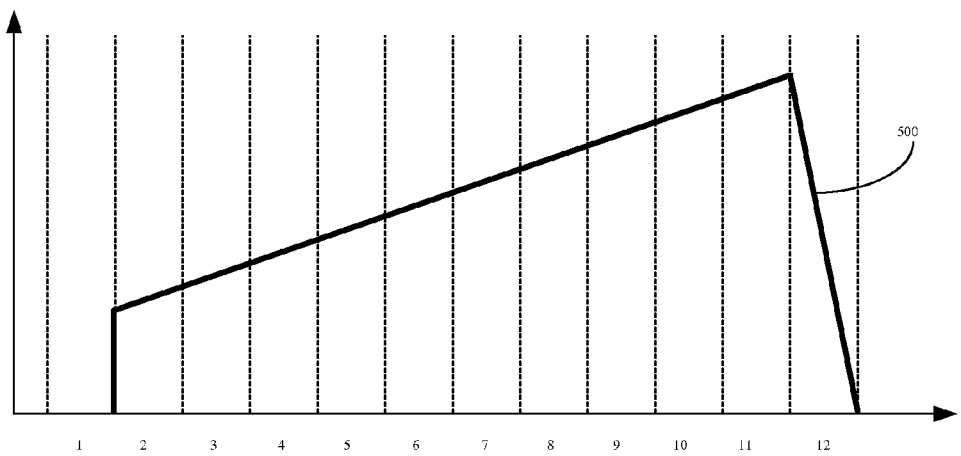
FIGS. 5A and 5B conceptually illustrate two exemplary embodiments of target sample distributions, in accordance with the present invention.
Figure 5B:
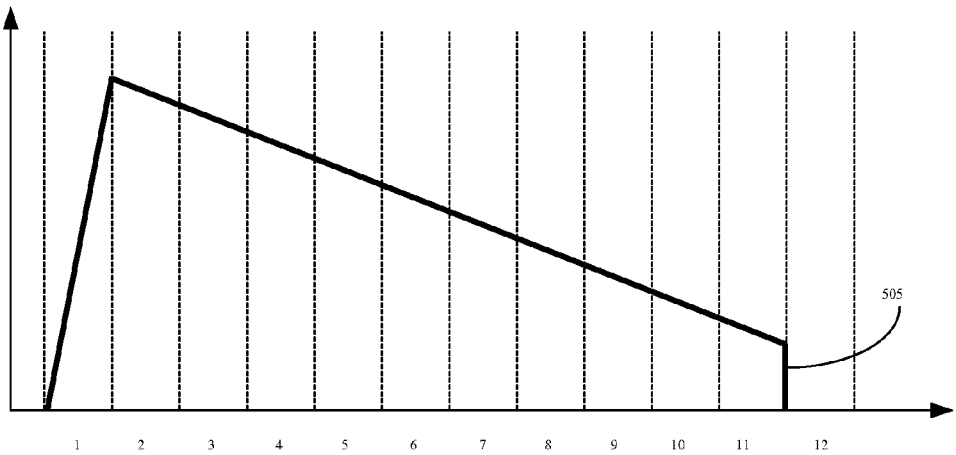

FIGS. 5A and 5B conceptually illustrate two exemplary embodiments of target sample distributions 500, 505. The vertical axis in FIGS. 5A and 5B indicates the number of samples and the horizontal axis indicates a bin number. FIG. 5A conceptually illustrates a target sample distribution 500 that provides a higher weighting to samples at higher bin numbers, which may represent higher powers. The target sample distribution 500 may be used to estimate the response matrix of an amplifier with poor high-power compression characteristics. FIG. 5B conceptually illustrates a target sample distribution 505 that provides a higher weighting to samples at lower bin numbers, which may represent lower powers. The target sample distribution 505 may be used to estimate the response matrix of an amplifier with poor low-power compression characteristics. However, as discussed above, persons of ordinary skill in the art should appreciate that any target sample distribution 500, 505 may be used.

Figure 6:
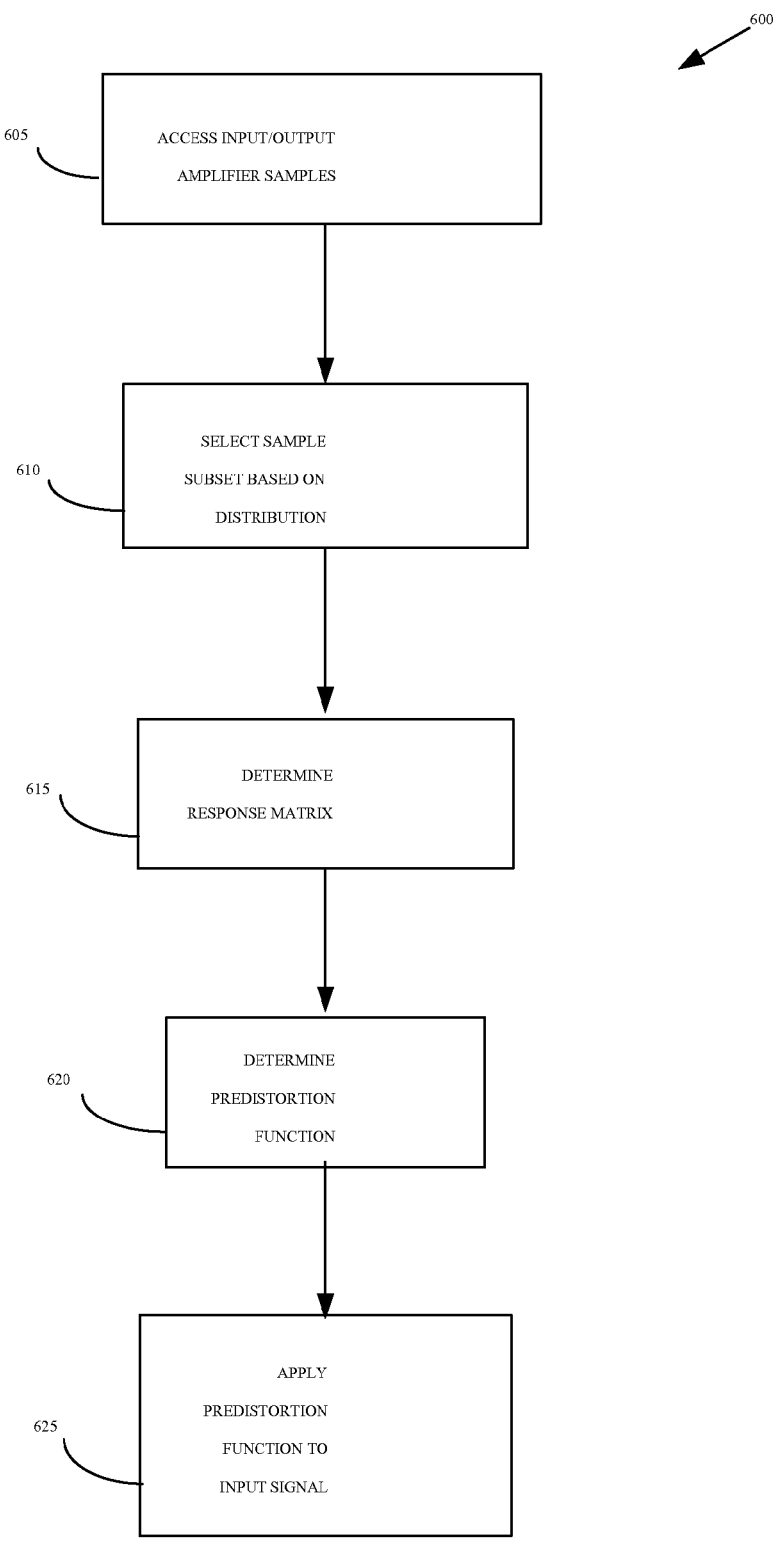
FIG. 6 conceptually illustrates a first exemplary embodiment of a method of selecting samples that may be used to estimate a digital amplifier predistortion function and/or coefficient, in accordance with the present invention.

FIG. 6 conceptually illustrates a first exemplary embodiment of a method 600 of selecting samples that may be used to estimate a digital amplifier predistortion function and/or coefficient. In the illustrated embodiment, one or more samples including information indicative of an input signal and an output signal associated with an amplifier are accessed (at 605). A subset of the samples is selected (at 610) based upon a target sample distribution. The subset of the samples may then be used to determine (at 615) elements of a response matrix associated with the amplifier. The response matrix may be used to determine (at 620) a predistortion function and/or coefficient, e.g., by inverting the response matrix. The response matrix and/or predistortion function may be determined (at 615 and/or 620) at a predetermined time interval or in response to an event, such as a temperature fluctuation. In one embodiment, the predistortion function and/or coefficients may be directly applied to the input signal to predistort the input signal. Alternatively, the predistortion function and/or coefficients may be stored in a lookup table for later use. For example, the predistortion function and/or coefficients may be stored in the lookup table and accessed based upon a power and/or temperature associated with the amplifier.

By determining the response matrix and/or the transfer function associated with an amplifier based on the subset of samples and/or the weighting functions, the number of samples used to generate an accurate estimate of the digital predistortion function and/or coefficients may be significantly reduced. For example, in one embodiment the number of samples may be reduced by approximately 90%. Accordingly, the processing time that may be necessary to determine the response matrix and/or invert the matrix to determine the predistortion coefficients, may be reduced and the quality of the estimate of the response matrix may be improved. Accordingly, the control unit 115 shown in FIG. 1 may be able to estimate the predistortion correction function faster, which may allow faster updates and/or tracking of the response of the amplifier 105 shown in FIG. 1 under various operating conditions. Faster estimations of the response matrix may also allow the amplifier system 100 to produce a transmitted spectrum with better spectral properties, which may introduce less nonlinear in-band distortion and/or spurious emissions in neighboring frequency bands.

Figure 7:
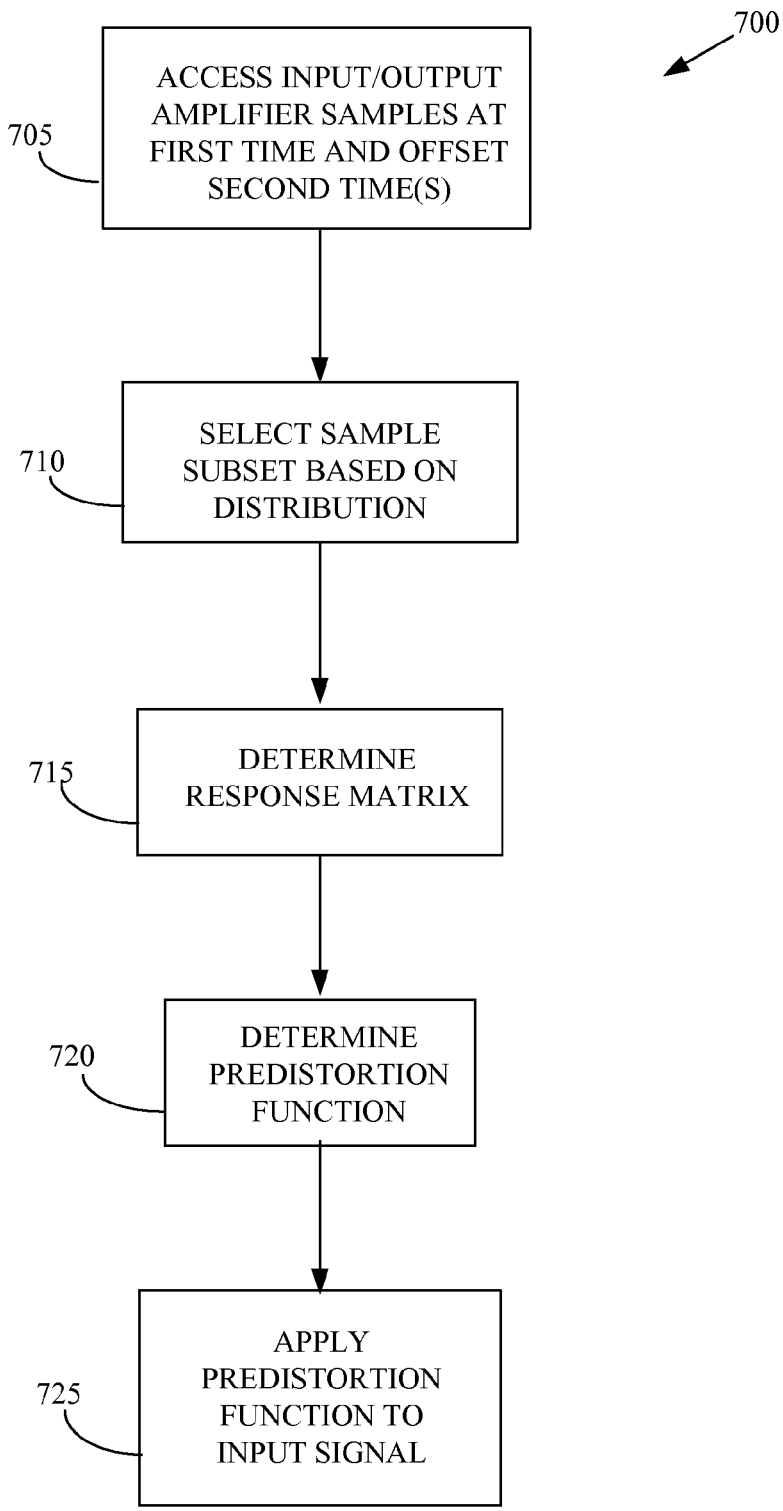
FIG. 7 conceptually illustrates a second exemplary embodiment of a method of selecting samples that may be used to estimate a digital amplifier predistortion function and/or coefficient, in accordance with the present invention.

FIG. 7 conceptually illustrates a second exemplary embodiment of a method 700 of selecting samples that may be used to estimate a digital amplifier predistortion function and/or coefficient. In the illustrated embodiment, samples including information indicative of an input signal and an output signal associated with an amplifier are accessed (at 705). The samples include a first sample that includes information indicative of the input signal and the output signal at a first time in at least one second sample that includes information indicative of the input signal and the output signal at a second time that is offset from the first time by a selected amount. For example, the input and output signals may be sampled at a series of times $t_i$, where the index i refers to the first sampling time. The input and output signals may also be sampled at a second time $t_{i-1}=t_i-\Delta t$, which precedes the first time by the offset time $\Delta t$. Furthermore, in alternative embodiments, the offset times for the offset samples may be selected based upon a frequency. For example, change in phase with respect to time may be used to determine an instantaneous frequency of a signal. A change in power with respect to time may be monitored and used to approximate the frequency. Fr example, samples that have a large change in power over a given interval of time have a higher instantaneous frequency than samples with a small change in power over the same interval of time.

Figure 8:
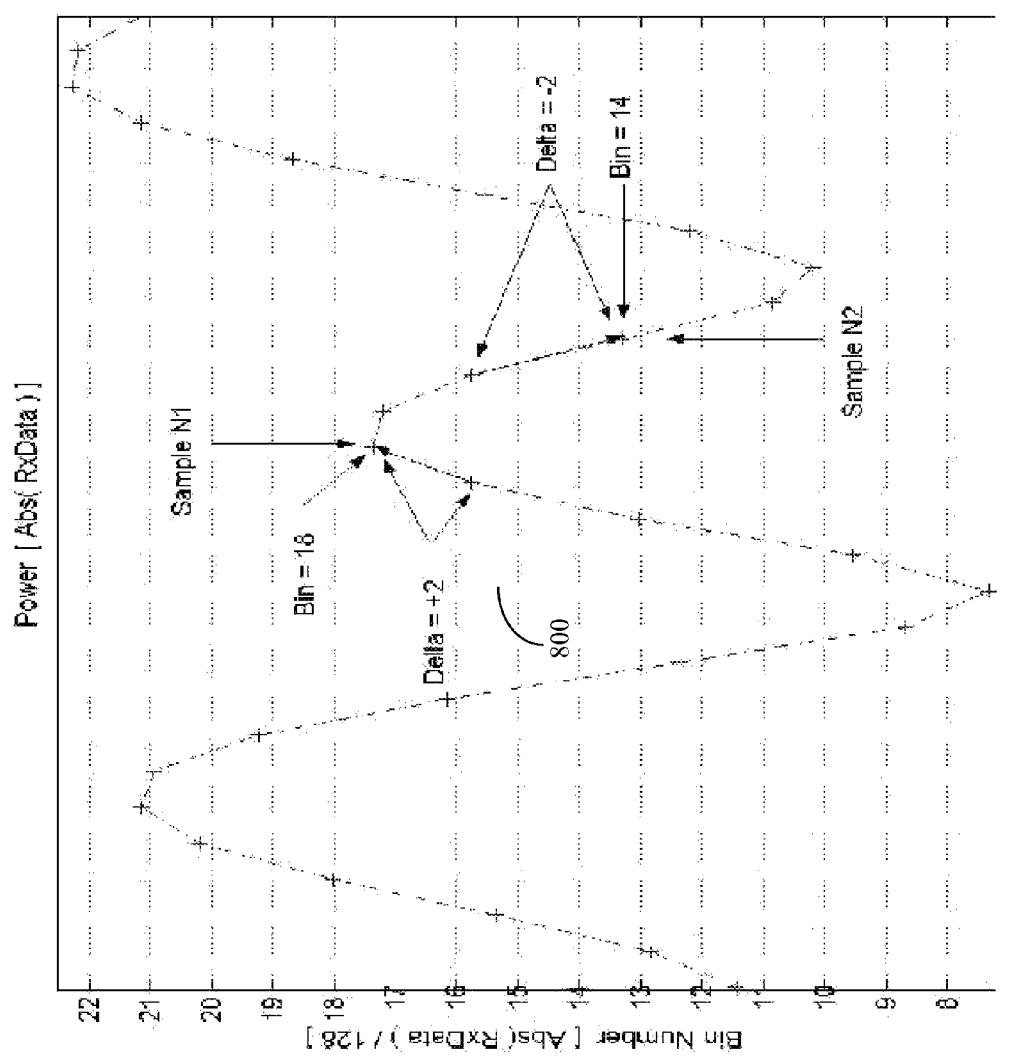
FIG. 8 conceptually illustrates one exemplary embodiment of a signal, in accordance with the present invention.

FIG. 8 conceptually illustrates one exemplary embodiment of a signal 800. The bin number representing the power of the signal is indicated on the vertical axis and the sample number is indicated on the horizontal axis. Persons of ordinary skill in the art should appreciate that the specific power levels associated with the bins and the specific time periods indicated by the sample numbers are matters of design choice and not material to the present invention. The individual samples of the signal 800 are indicated by crosses on the curve representing the signal 800. In the illustrated embodiment, a sample N1 is sampled at a first time and has a power that corresponds to the power bin 18. A second sample N2 is sampled that a second time and has a power that corresponds to the power bin 14.

The first and second samples N1 and N2 are associated with samples taken at second times that are offset from the first sample times by a selected offset time. In the illustrated embodiment, the offset time is selected to be one sample number bin. For example, the first sample N1 is associated with a previous sample that corresponds to the power bin 16 so that the difference between the power bin associated with the first sample N1 and the previous sample is Delta=+2 indicating that the power level has increased by two bins between the previous sample and the current (first) sample N1. The second sample N2 is associated with a previous sample that corresponds to the power bin 16 so that the difference between the power bin associated with the second sample N2 and the previous sample is Delta=−2 indicating that the power level has decreased by two bins between the previous sample and the current (second) sample N2. Although each sample N1, N2 discussed above is associated with a single offset sample, the present invention is not so limited. In alternative embodiments, each sample at a first time may be associated with any number of second times corresponding to any number of selected positive or negative offsets. In alternative embodiments, the offset times for the offset samples may be selected based upon a frequency.

Figure 9:
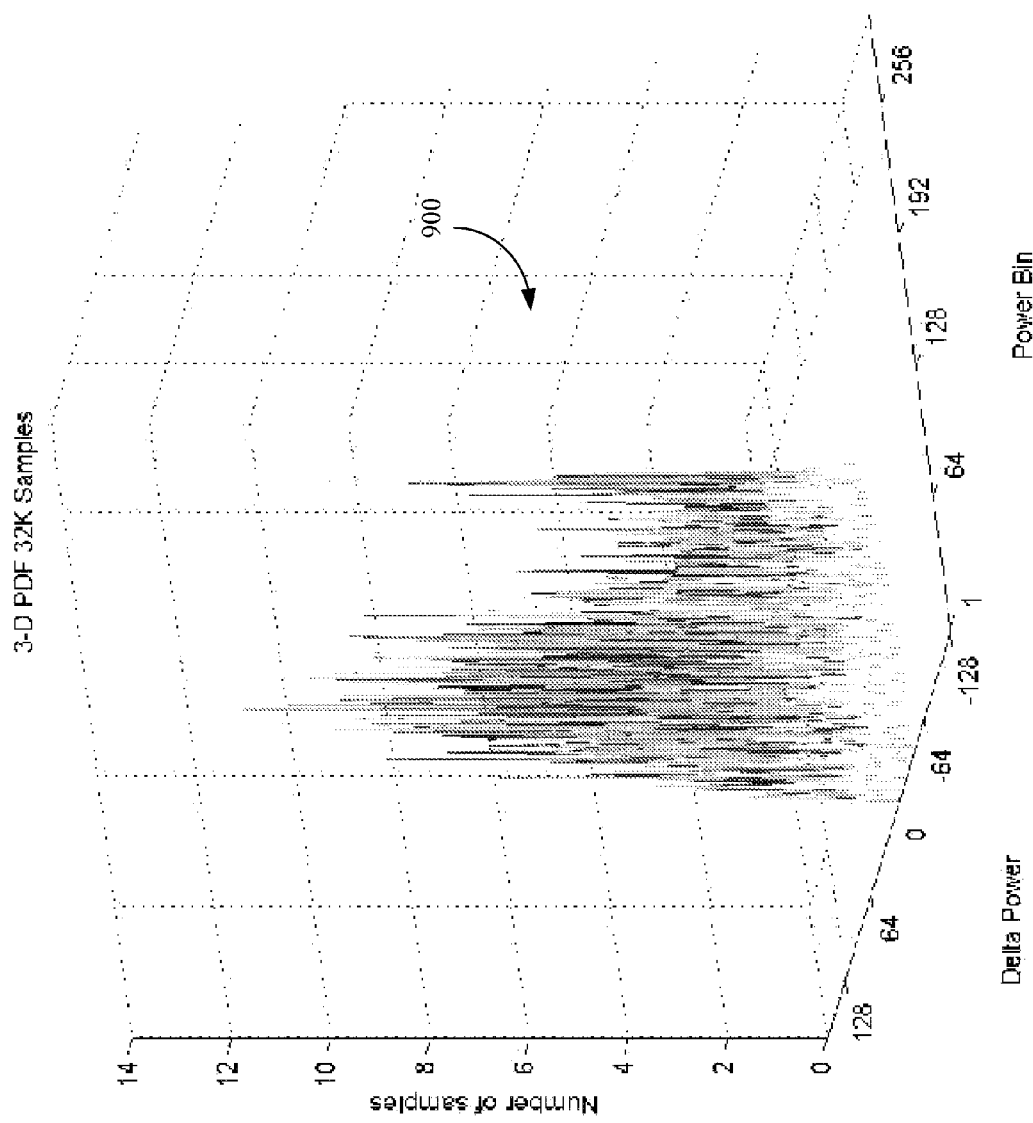
FIG. 9 plots a power distribution function of 32,000 samples associated with input and output signals, in accordance with the present invention.

FIG. 9 plots a power distribution function 900 of 32,000 samples associated with input and output signals. In the illustrated embodiment, the power of each sample is indicated on a first horizontal axis and the powers of the samples taken at the offset times is indicated on a second horizontal axis. In the illustrated embodiment, the power associated with each sample is indicated by the power bin number of associated with the power and the powers of the samples taken at the offset times is expressed as a difference between the power bin of the sample at the first time and the power bin of the sample at the offset time. The power distribution function 900 is approximately a Rayleigh distribution along the first horizontal axis and is approximately a Gaussian distribution along the second horizontal axis, as will be illustrated in more detail below. The peak in the power distribution function 900 along the first horizontal axis at large values of the power bin is an artifact of the sampling technique. The offset time in the illustrated embodiment is one 92.16 Mhz sample period or 1/92.16 Mhz=10.085 nS.

Figure 10:
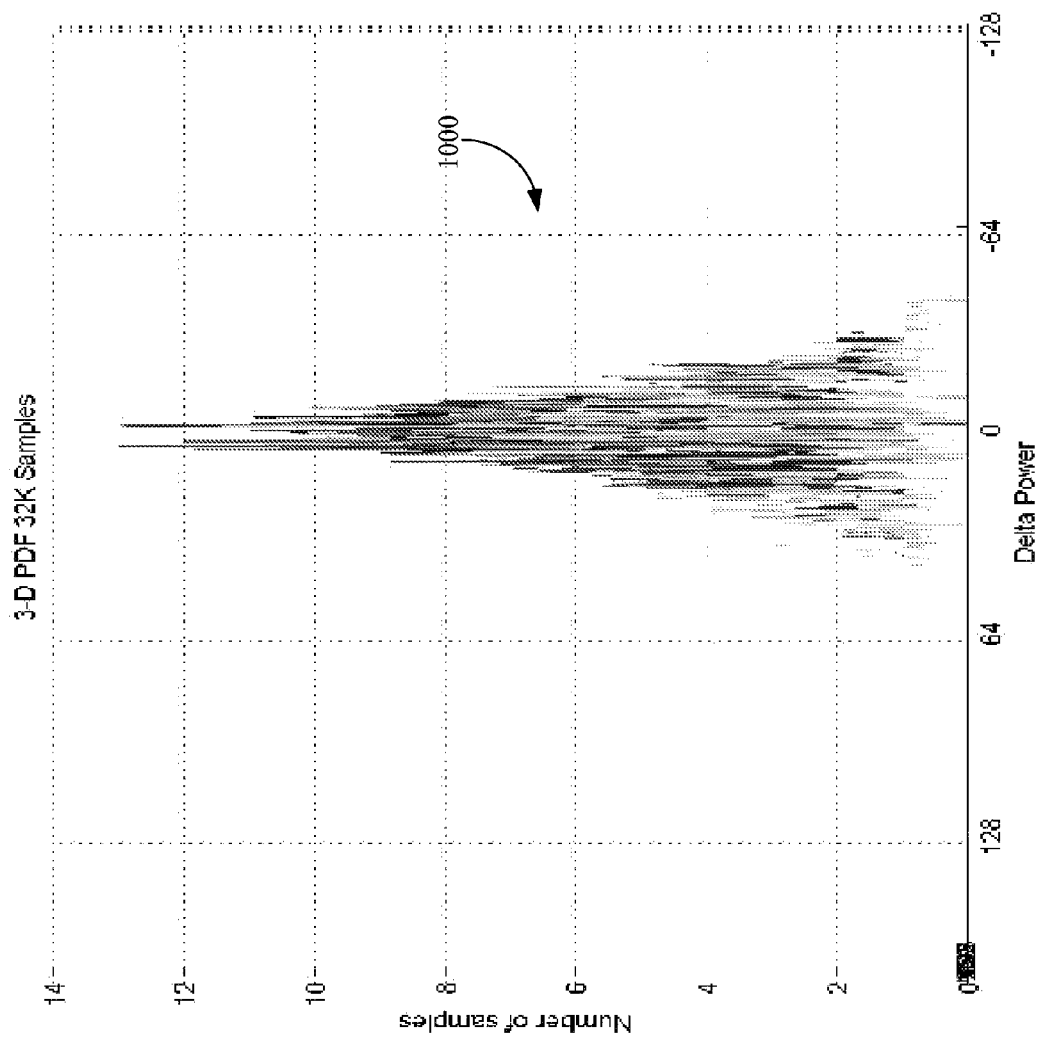
FIG. 10 plots a first cross-sectional view of the power distribution function of the 32,000 samples shown in FIG. 9, in accordance with the present invention.

FIG. 10 plots a first cross-sectional view 1000 of the power distribution function of the 32,000 samples shown in FIG. 9. In the illustrated embodiment, the horizontal axis indicates the power difference between the sample at a first time and sample(s) taken at offset second times. The power difference is represented as a difference between the power bin corresponding to the sample taken at the first time and the power bin corresponding to the samples taken at the offset times. The vertical axis indicates the number of samples corresponding to each value of the power difference. The cross-sectional view 1000 of the power distribution function shows that the samples are approximately distributed with a Gaussian function having a peak at a Delta Power of approximately 0.

Figure 11:
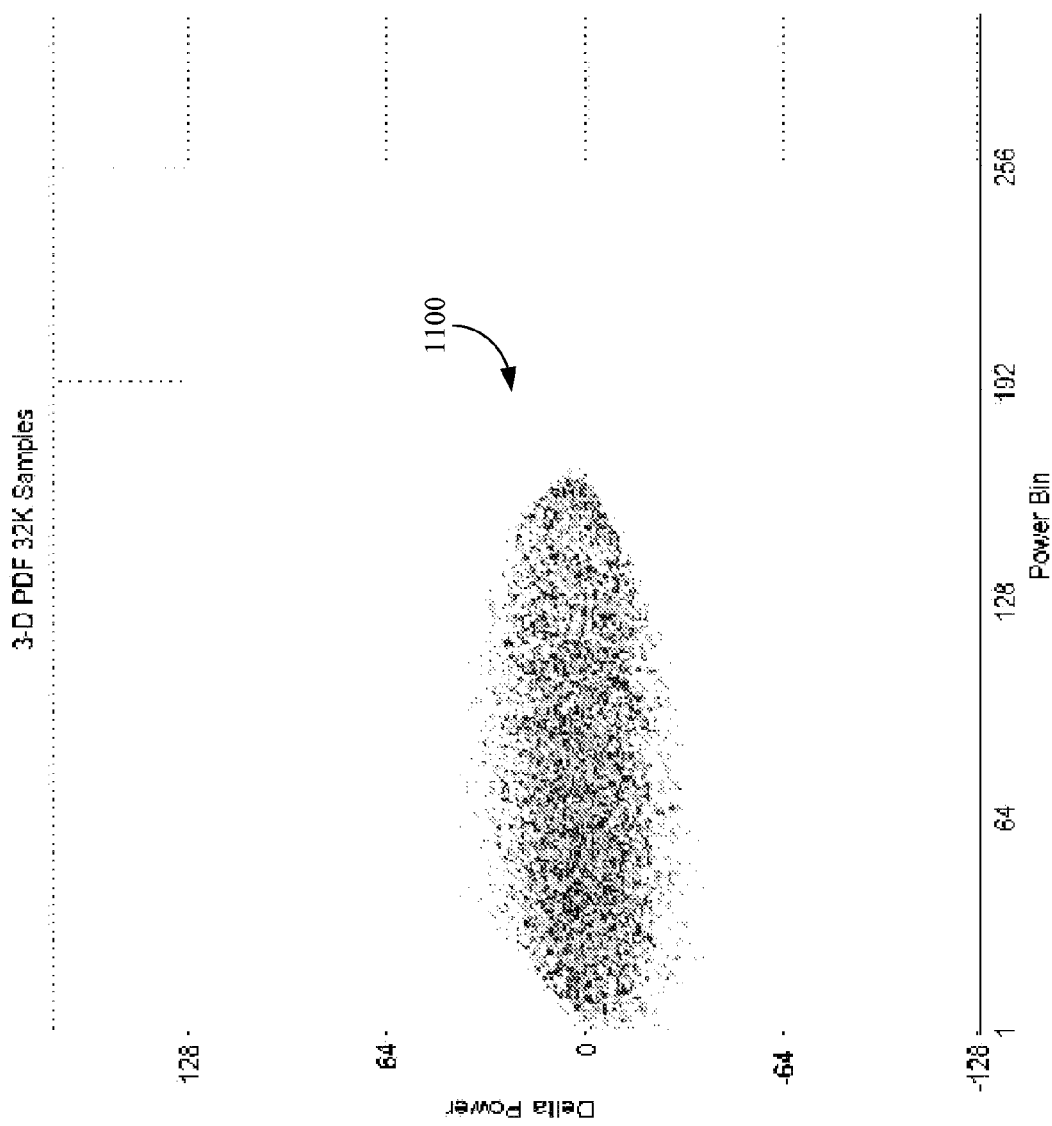
FIG. 11 plots a top-down view of the power distribution function of the 32,000 samples shown in FIG. 9, in accordance with the present invention.

FIG. 11 plots a top-down view 1100 of the power distribution function of the 32,000 samples shown in FIG. 9. In the illustrated embodiment, the horizontal axis indicates the power associated with samples taken at the first time, which is represented as a power bin in FIG. 11. The vertical axis indicates the power difference between the sample at the first time and sample(s) taken at offset second times. The power difference is represented as a difference between the power bin corresponding to the sample taken at the first time and the power bin corresponding to the samples taken at the offset times. The top-down view 1100 of the power distribution function indicates that the range of power differences between the samples at the first time and the offset times increases towards the center (as a function of the power bin) of the power distribution function.

Figure 12:
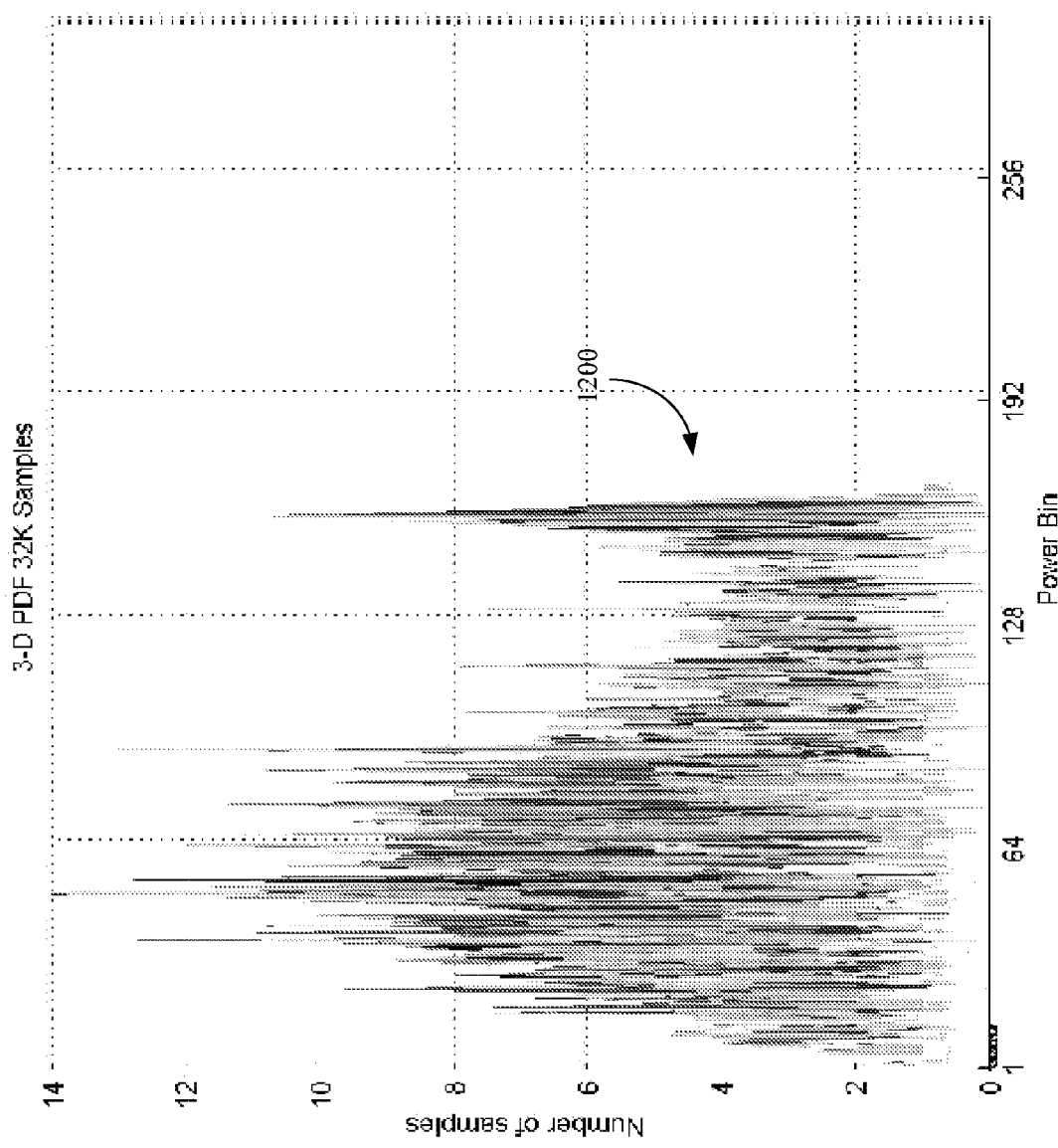
FIG. 12 plots a second cross-sectional view of the power distribution function of the 32,000 samples shown in FIG. 9, in accordance with the present invention.

FIG. 12 plots a second cross-sectional view 1200 of the power distribution function of the 32,000 samples shown in FIG. 9. In the illustrated embodiment, the horizontal axis indicates the power associated with samples taken at the first time, which is represented as a power bin in FIG. 11. The vertical axis indicates the number of samples corresponding to each value of the power difference. The second cross-sectional view 1200 of the power distribution function shows that the samples are approximately distributed with a Rayleigh distribution having a peak at a power bin of approximately 40. The peak in the power distribution function 1200 at values of the power bin greater than approximately 128 is an artifact of the sampling technique.

Referring back to FIG. 7, a subset of the input/output amplifier samples may then be selected (at 710) based upon a distribution. A variety of distribution may be used to select (at 710) the subset of the samples. Exemplary distributions include, but are not limited to square waves, Gaussian functions, Rayleigh functions, and the like. In some alternative embodiments, waiting functions may also be applied across the dynamic range of operation. For example, if an amplifier with a poor high power compression characteristic is to be estimated, higher power samples in the estimate may be rated higher. For another example, higher frequency samples may be given a higher weight or, alternatively, combinations of high frequency and/or high power samples may be given higher weights. As discussed above, the distribution may be used to set one or more thresholds associated with the number of samples in a given bin. Samples in each of the bins may then be collected until the number of samples in the bin exceeds the threshold value determined using the distribution. Subsequent samples that are associated with these bins may then be discarded.

Figure 13:
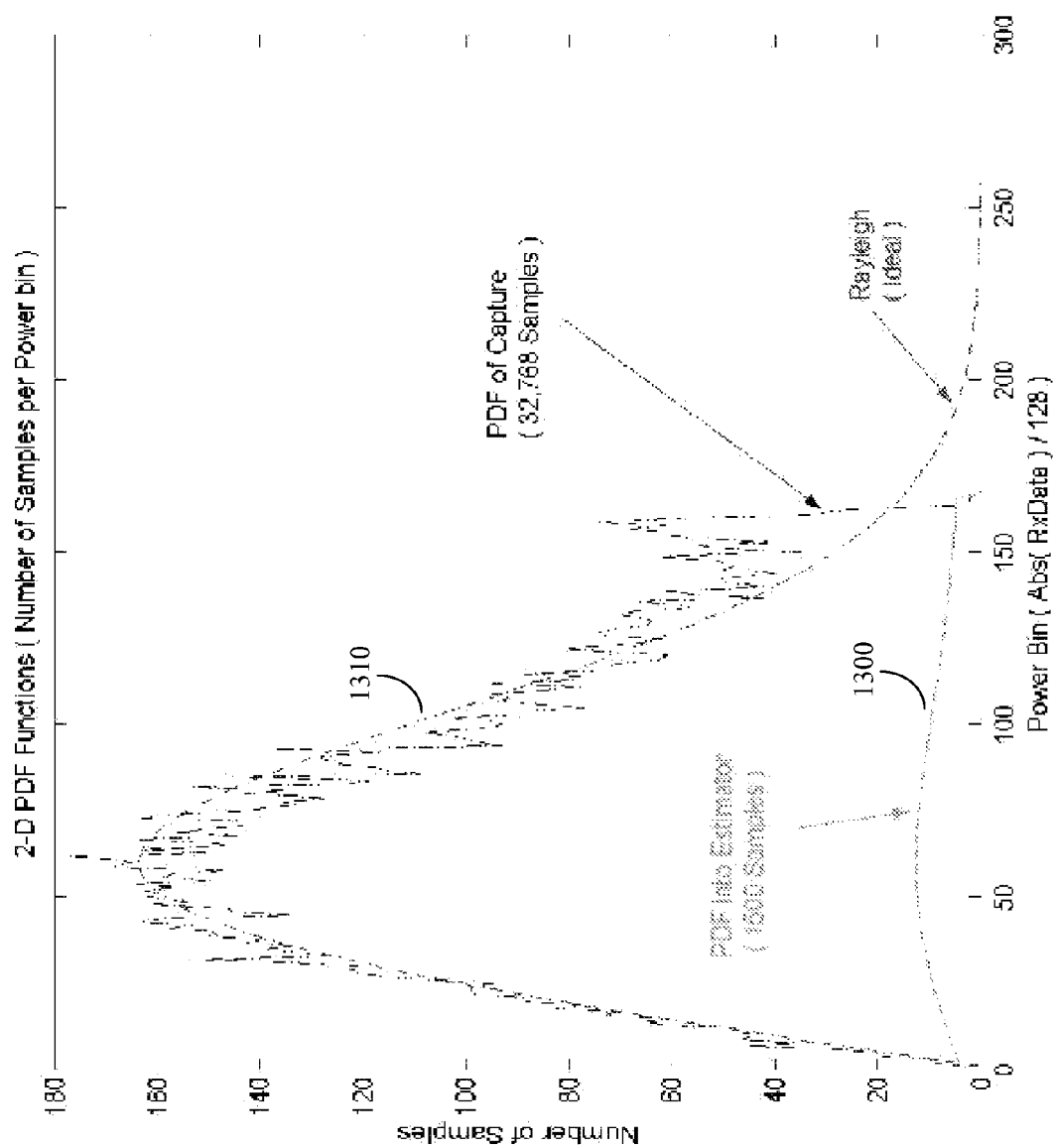
FIG. 13 plots one exemplary embodiment of a two-dimensional distribution, in accordance with the present invention.

FIG. 13 plots one exemplary embodiment of a two-dimensional distribution 1300. In the illustrated embodiment, the horizontal axis indicates the power associated with samples taken at the first time, which is represented as a power bin in FIG. 13. The vertical axis indicates the number of samples corresponding to each value of the power difference. The two-dimensional distribution 1300 is a scaled-down version of a Rayleigh distribution that approximately corresponds to the power distribution function 1310 of the captured samples shown in FIG. 9. In one embodiment, the two-dimensional distribution 1300 may be combined with a second distribution that indicates a sample distribution with respect to powers (or power differences) associated with the offset samples. For example, a square wave may be used to select (at 710) the offset samples for each power bin.

Figure 14:
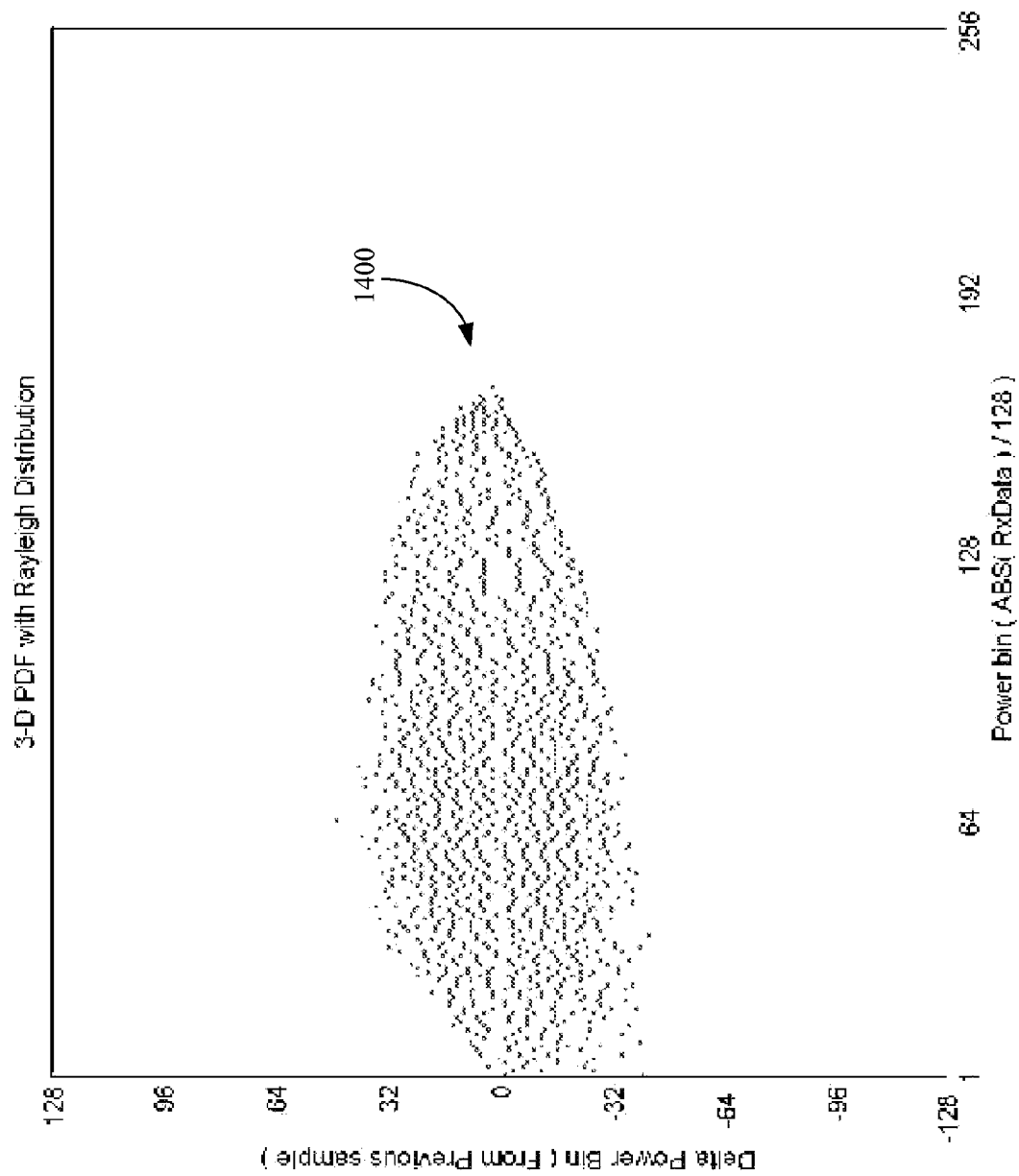
FIG. 14 plots a top-down view of a power distribution function of samples that have been selected by applying a Rayleigh function and a square wave distribution, in accordance with the present invention.

FIG. 14 plots a top-down view 1400 of the power distribution function of samples that have been selected by applying the two-dimensional Rayleigh function and the square wave distribution discussed above. In the illustrated embodiment, the horizontal axis indicates the power associated with samples taken at the first time, which is represented as a power bin in FIG. 14. The vertical axis indicates the power difference between the sample at the first time and sample(s) taken at offset second times. The power difference is represented as a difference between the power bin corresponding to the sample taken at the first time and the power bin corresponding to the samples taken at the offset times. The top-down view 1400 of the power distribution function of the selected samples indicates that the range of power differences between the samples at the first time and the offset times increases towards the center (as a function of the power bin) of the power distribution function of the selected samples.

Referring back to FIG. 7, the subset of the input/output amplifier samples may alternatively be selected (at 710) based upon a square-wave distribution in both dimensions. Foe example, the sample distribution may be formed using a first square wave distribution of the sample with respect to powers associated with the samples collected at a first time and at least one second square wave distribution of the sample with respect to offset powers associated with the samples collected at one or more offset times. The first and square waves may be used to indicate thresholds in the number of samples in each been associated with a power and an offset power. Once the number of samples in each bin exceeds the threshold, then subsequent samples in these bins may be discarded.

Figure 15:
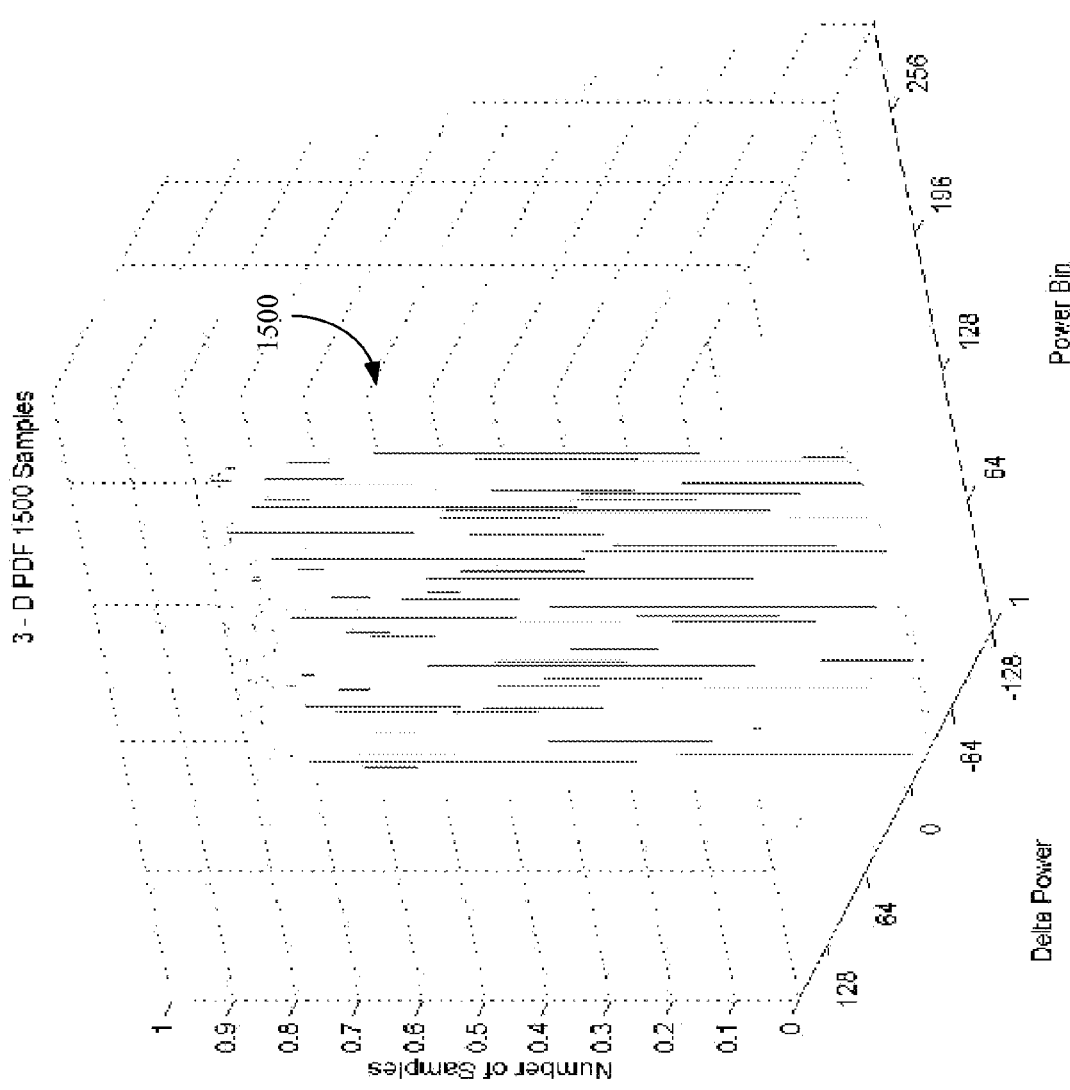
FIG. 15 plots a power distribution function that includes approximately 1500 samples associated with input and output signals, in accordance with the present invention.

FIG. 15 plots a power distribution function 1500 that includes approximately 1500 samples associated with input and output signals. The samples have been selected from the sample distribution shown in FIG. 9 using a distribution formed of two square waves, as discussed above. In the illustrated embodiment, the power of each sample is indicated on a first horizontal axis and the powers of the samples taken at the offset times is indicated on a second horizontal axis. In the illustrated embodiment, the power associated with each sample is indicated by the power bin number of associated with the power and the powers of the samples taken at the offset times is expressed as a difference between the power bin of the sample at the first time and the power bin of the sample at the offset time. The power distribution function 1500 of the selected samples is approximately a square wave distribution along the first horizontal axis and is approximately a square wave distribution along the second horizontal axis.

Figure 16:
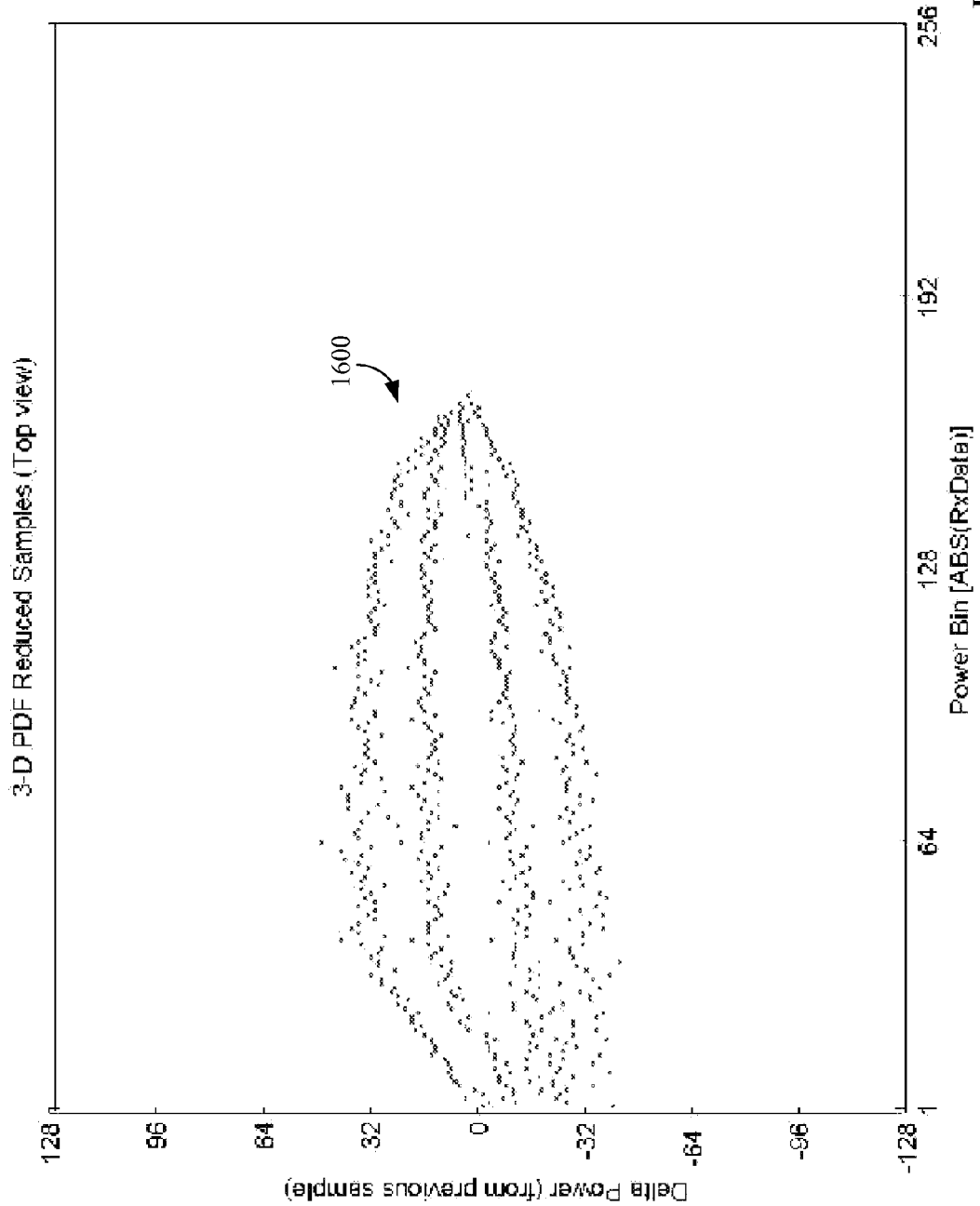
FIG. 16 plots a top-down view of the power distribution function of samples that have been selected by selecting samples from the power distribution function shown in FIG. 9, in accordance with the present invention.

FIG. 16 plots a top-down view 1600 of the power distribution function of samples that have been selected by selecting samples from the power distribution function shown in FIG. 9. In the illustrated embodiment, the horizontal axis indicates the power associated with samples taken at the first time, which is represented as a power bin in FIG. 14. The vertical axis indicates the power difference between the sample at the first time and sample(s) taken at offset second times. The power difference is represented as a difference between the power bin corresponding to the sample taken at the first time and the power bin corresponding to the samples taken at the offset times. The samples are selected by determining the largest power differences between samples that a first time and corresponding offset samples in both the positive and negative power offset directions. Samples are also selected for power differences intermediate the largest power differences. Accordingly, four samples are selected per power bin. The top-down view 1600 of the power distribution function of the selected samples shows that the selected samples are grouped into four approximately distinct sequences of samples. Approximately 700 samples are selected and shown in FIG. 16.

Referring back to FIG. 7, the subset of the samples may then be used to determine (at 715) elements of a response matrix associated with the amplifier. The response matrix may be used to determine (at 720) a predistortion function and/or coefficient, e.g., by inverting the response matrix. The response matrix and/or predistortion function may be determined (at 715 and/or 720) at a predetermined time interval or in response to an event, such as a temperature fluctuation. In one embodiment, the predistortion function and/or coefficients may be directly applied to the input signal to predistort the input signal. Alternatively, the predistortion function and/or coefficients may be stored in a lookup table for later use. For example, the predistortion function and/or coefficients may be stored in the lookup table and accessed based upon a power and/or temperature associated with the amplifier.

By determining the response matrix and/or the transfer function associated with an amplifier based on the subset of samples that is selected using a time- or frequency-based weighting scheme, the number of samples used to generate an accurate estimate of the digital predistortion function and/or coefficients may be significantly reduced with respect to both conventional practice and with respect to the first embodiment of the sample selection scheme described above. For example, in one embodiment the number of samples may be reduced by approximately 95-98%. Accordingly, the processing time that may be necessary to determine the response matrix and/or invert the matrix to determine the predistortion coefficients, may be reduced and the quality of the estimate of the response matrix may be improved with respect to both conventional practice and with respect to the first embodiment of the sample selection scheme described above. Accordingly, the control unit 115 shown in FIG. 1 may be able to estimate the predistortion correction function faster, which may allow faster updates and/or tracking of the response of the amplifier 105 shown in FIG. 1 under various operating conditions. Faster estimations of the response matrix may also allow the amplifier system 100 to produce a transmitted spectrum with better spectral properties, which may introduce less nonlinear in-band distortion and/or spurious emissions in neighboring frequency bands.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    accessing a plurality of composite samples, each composite sample comprising information associated with an input signal and a corresponding output signal of an amplifier, and each of the plurality of composite samples including at least one first sample acquired at a first time and at least one second sample acquired at a second time displaced from the first time by at least one selected time interval;
    selecting a subset of the plurality of composite samples based on a sample distribution of the composite samples; and
    determining a predistortion function based on the subset of the plurality of composite samples.

2. The method of claim 1, wherein accessing each of the plurality of composite samples comprises accessing information indicative of a plurality of powers associated with the input signal and the output signal at the first time and at the second time.

3. The method of claim 1, comprising selecting said at least one time interval.

4. The method of claim 3, comprising selecting a plurality of time intervals, and wherein said at least one second sample comprises a plurality of second samples, each second sample being displaced from said at least one first sample by the selected plurality of time intervals.

5. The method of claim 4, wherein selecting the plurality of time intervals comprises selecting at least one look-back time interval and at least one look-ahead time interval.

6. The method of claim 1, wherein selecting the subset of the plurality of composite samples comprises associating each composite sample with one of a plurality of bins based on a characteristic of said at least one first sample and a characteristic of said at least one second sample.

7. The method of claim 6, wherein associating each composite sample with one of the plurality of bins comprises associating each composite sample with one of the plurality of bins based on a power associated with said at least one first sample and a power associated with said at least one second sample, thereby creating a multi-dimensional distribution of the composite samples.

8. The method of claim 6, wherein selecting the subset of the plurality of composite samples comprises determining a threshold for each of the plurality of bins based on the sample distribution.

9. The method of claim 8, wherein selecting the subset of the plurality of composite samples comprises associating each composite sample with one of the plurality of bins if the number of samples in said one of the plurality of bins is less than the threshold for said one of the plurality of bins.

10. The method of claim 1, comprising determining a transfer function associated with the amplifier based on the subset of the plurality of samples and determining the predistortion function based on the transfer function.

11. The method of claim 10, wherein determining the transfer function comprises determining the transfer function at a predetermined time interval.

12. The method of claim 10, wherein determining the transfer function comprises:
    determining a correlation matrix; and
    inverting the correlation matrix.

13. The method of claim 1, comprising storing the predistortion function in a lookup table.

14. The method of claim 1, comprising applying the predistortion function to the input signal of the amplifier.

15. The method of claim 14, wherein applying the predistortion function comprises accessing a predistortion function from a lookup table.

16. A method involving a radiofrequency amplifier in a wireless communication device, comprising:
    accessing a plurality of composite samples, each composite sample comprising information associated with an input radiofrequency signal and a corresponding output radiofrequency signal of the amplifier, and each of the plurality of composite samples including at least one first sample acquired at a first time and at least one second sample acquired at a second time displaced from the first time by at least one selected time interval;

selecting a subset of the plurality of samples based on a sample distribution of the composite samples;

determining a predistortion function based on the subset of the plurality of composite samples.

17. The method of claim 16, wherein accessing the plurality of samples comprises accessing information indicative of a plurality of powers associated with the input radiofrequency signal and the output radiofrequency signal.

18. The method of claim 16, comprising selecting said at least one time interval.

19. The method of claim 18, comprising selecting a plurality of time intervals, and wherein said at least one second sample comprises a plurality of second samples, each second sample being displaced from said at least one first sample by the selected plurality of time intervals.

20. The method of claim 19, wherein selecting the plurality of time intervals comprises selecting at least one look-back time interval and at least one look-ahead time interval.

21. The method of claim 16, wherein selecting the subset of the plurality of composite samples comprises associating each composite sample with one of a plurality of bins based on a characteristic of said at least one first sample and a characteristic of said at least one second sample.

22. The method of claim 21, wherein associating each composite sample with one of the plurality of bins comprises associating each composite sample with one of the plurality of bins based on a radiofrequency power associated with said at least one first sample and a radiofrequency power associated with said at least one second sample.

23. The method of claim 21, wherein selecting the subset of the plurality of composite samples comprises determining a threshold for each of the plurality of bins based on the sample distribution.

24. The method of claim 23, wherein selecting the subset of the plurality of composite samples comprises associating each composite sample with one of the plurality of bins if the number of composite samples in said one of the plurality of bins is less than the threshold for said one of the plurality of bins.

25. The method of claim 16, comprising determining a transfer function associated with the amplifier based on the subset of the plurality of composite samples and determining the predistortion function based on the transfer function.

26. The method of claim 25, wherein determining the transfer function comprises determining the transfer function at a predetermined time interval.

27. The method of claim 25, wherein determining the transfer function comprises:

determining a correlation matrix; and inverting the correlation matrix.

28. The method of claim 16, comprising storing the predistortion function in a lookup table, and wherein applying the predistortion function comprises accessing a predistortion function from the lookup table.

29. The method of claim 16, comprising applying the predistortion function to the input radiofrequency signal of the amplifier.

30. The method of claim 29, wherein applying the predistortion function comprises accessing a predistortion function from a lookup table.

* * * * *